United States Patent
Mandelboum et al.

(10) Patent No.: US 10,257,932 B2
(45) Date of Patent: Apr. 9, 2019

(54) LASER DIODE CHIP ON PRINTED CIRCUIT BOARD

(71) Applicant: Microsoft Technology Licensing, LLC., Redmond, WA (US)

(72) Inventors: David Mandelboum, Rakefet (IL); Shlomo Felzenshtein, Nesher (IL); Boaz Shem-Tov, Raanana (IL); Raymond Kirk Price, Redmond, WA (US); Ravi Kiran Nalla, San Jose, CA (US)

(73) Assignee: Microsoft Technology Licensing, LLC., Redmond, WA (US)

( * ) Notice: Subject to any disclaimer, the term of this patent is extended or adjusted under 35 U.S.C. 154(b) by 124 days.

(21) Appl. No.: 15/044,526

(22) Filed: Feb. 16, 2016

(65) Prior Publication Data

US 2017/0238420 A1    Aug. 17, 2017

(51) Int. Cl.
| | |
|---|---|
| *H05K 1/11* | (2006.01) |
| *H05K 1/18* | (2006.01) |
| *H05K 1/02* | (2006.01) |
| *H05K 3/32* | (2006.01) |
| *G03B 15/03* | (2006.01) |

(Continued)

(52) U.S. Cl.
CPC .......... *H05K 1/115* (2013.01); *F21V 19/0015* (2013.01); *G03B 15/03* (2013.01); *H05K 1/0206* (2013.01); *H05K 1/0207* (2013.01); *H05K 1/0298* (2013.01); *H05K 1/181* (2013.01); *H05K 3/0061* (2013.01); *H05K 3/321* (2013.01); *H05K 3/4602* (2013.01); *H05K 3/4608* (2013.01); *H05K 3/4617* (2013.01); *H05K 3/4644* (2013.01); *H05K 3/4652* (2013.01); *F21Y 2115/30* (2016.08);

(Continued)

(58) Field of Classification Search
CPC . H05K 1/11; H05K 1/274; H05K 3/42; H05K 7/20; H01L 33/08; H01L 33/10; H01L 33/62; H01L 33/64; C25D 5/00; C25D 5/02; C25D 5/12; C25D 5/48
USPC ....... 174/260, 252, 262; 372/34, 36; 257/99, 257/722, 728
See application file for complete search history.

(56) References Cited

U.S. PATENT DOCUMENTS

| | | | |
|---|---|---|---|
| 4,199,703 | A | 4/1980 | Samson |
| 4,288,078 | A | 9/1981 | Lugo |

(Continued)

FOREIGN PATENT DOCUMENTS

| | | |
|---|---|---|
| CN | 1866565 A | 11/2006 |
| CN | 1945844 A | 11/2007 |

(Continued)

OTHER PUBLICATIONS

Xie, et al., "Optimization of Thermal Management Techniques for Low Cost Optoelectronic Packages", In Proceedings of 4th Electronics Packaging Technology Conference, Dec. 10, 2002, pp. 375-379.

(Continued)

*Primary Examiner* — Xiaoliang Chen

(57) ABSTRACT

A light source module comprising a semiconductor light source mounted directly to a conducting trace of a multilayer printed circuit board having a core comprising a plurality of core layers electrically and thermally coupled by a plurality of buried vias wherein at least one of the core layers comprises a heat sink plane.

20 Claims, 3 Drawing Sheets

(51) Int. Cl.
  *F21V 19/00* (2006.01)
  *H05K 3/00* (2006.01)
  *H05K 3/46* (2006.01)
  *F21Y 115/30* (2016.01)

(52) U.S. Cl.
  CPC ............ *H05K 2201/09536* (2013.01); *H05K 2201/10121* (2013.01); *H05K 2203/049* (2013.01)

(56) References Cited

U.S. PATENT DOCUMENTS

| | | |
|---|---|---|
| 4,470,801 A | 9/1984 | Broadt |
| 4,627,620 A | 12/1986 | Yang |
| 4,630,910 A | 12/1986 | Ross et al. |
| 4,645,458 A | 2/1987 | Williams |
| 4,689,797 A | 8/1987 | Olshansky |
| 4,695,953 A | 9/1987 | Blair et al. |
| 4,702,475 A | 10/1987 | Elstein et al. |
| 4,709,370 A | 11/1987 | Bednarz et al. |
| 4,711,543 A | 12/1987 | Blair et al. |
| 4,751,642 A | 6/1988 | Silva et al. |
| 4,796,997 A | 1/1989 | Svetkoff et al. |
| 4,809,065 A | 2/1989 | Harris et al. |
| 4,817,950 A | 4/1989 | Goo |
| 4,843,568 A | 6/1989 | Krueger et al. |
| 4,893,183 A | 1/1990 | Nayar |
| 4,901,362 A | 2/1990 | Terzian |
| 4,925,189 A | 5/1990 | Braeunig |
| 5,101,444 A | 3/1992 | Wilson et al. |
| 5,136,152 A | 8/1992 | Lee |
| 5,148,154 A | 9/1992 | MacKay et al. |
| 5,184,295 A | 2/1993 | Mann |
| 5,229,754 A | 7/1993 | Aoki et al. |
| 5,229,756 A | 7/1993 | Kosugi et al. |
| 5,239,463 A | 8/1993 | Blair et al. |
| 5,239,464 A | 8/1993 | Blair et al. |
| 5,241,552 A | 8/1993 | Bergmann |
| 5,288,078 A | 2/1994 | Capper et al. |
| 5,295,491 A | 3/1994 | Gevins |
| 5,320,538 A | 6/1994 | Baum |
| 5,347,306 A | 9/1994 | Nitta |
| 5,385,519 A | 1/1995 | Hsu et al. |
| 5,405,152 A | 4/1995 | Katanics et al. |
| 5,417,210 A | 5/1995 | Funda et al. |
| 5,423,554 A | 6/1995 | Davis |
| 5,454,043 A | 9/1995 | Freeman |
| 5,469,740 A | 11/1995 | French et al. |
| 5,495,576 A | 2/1996 | Ritchey |
| 5,516,105 A | 5/1996 | Eisenbrey et al. |
| 5,524,637 A | 6/1996 | Erickson |
| 5,534,917 A | 7/1996 | MacDougall |
| 5,563,988 A | 10/1996 | Maes et al. |
| 5,569,957 A | 10/1996 | McLean |
| 5,577,981 A | 11/1996 | Jarvik |
| 5,580,249 A | 12/1996 | Jacobsen et al. |
| 5,594,469 A | 1/1997 | Freeman et al. |
| 5,597,309 A | 1/1997 | Riess |
| 5,616,078 A | 4/1997 | Oh |
| 5,617,312 A | 4/1997 | Iura et al. |
| 5,638,300 A | 6/1997 | Johnson |
| 5,641,288 A | 6/1997 | Zaenglein, Jr. |
| 5,682,196 A | 10/1997 | Freeman |
| 5,682,229 A | 10/1997 | Wangler |
| 5,690,582 A | 11/1997 | Ulrich et al. |
| 5,703,367 A | 12/1997 | Hashimoto et al. |
| 5,704,837 A | 1/1998 | Iwasaki et al. |
| 5,715,834 A | 2/1998 | Bergamasco et al. |
| 5,808,325 A | 9/1998 | Webb |
| 5,875,108 A | 2/1999 | Hoffberg et al. |
| 5,877,803 A | 3/1999 | Wee et al. |
| 5,913,727 A | 6/1999 | Ahdoot |
| 5,933,125 A | 8/1999 | Fernie et al. |
| 5,980,256 A | 11/1999 | Carmein |
| 5,989,157 A | 11/1999 | Walton |
| 5,995,649 A | 11/1999 | Marugame |
| 6,005,548 A | 12/1999 | Latypov et al. |
| 6,009,210 A | 12/1999 | Kang |
| 6,054,991 A | 4/2000 | Crane et al. |
| 6,066,075 A | 5/2000 | Poulton |
| 6,072,494 A | 6/2000 | Nguyen |
| 6,073,489 A | 6/2000 | French et al. |
| 6,077,201 A | 6/2000 | Cheng |
| 6,098,458 A | 8/2000 | French et al. |
| 6,100,896 A | 8/2000 | Strohecker et al. |
| 6,101,289 A | 8/2000 | Kellner |
| 6,128,003 A | 10/2000 | Smith et al. |
| 6,130,677 A | 10/2000 | Kunz |
| 6,141,463 A | 10/2000 | Covell et al. |
| 6,147,678 A | 11/2000 | Kumar et al. |
| 6,152,856 A | 11/2000 | Studor et al. |
| 6,159,100 A | 12/2000 | Smith |
| 6,173,066 B1 | 1/2001 | Peurach et al. |
| 6,181,343 B1 | 1/2001 | Lyons |
| 6,188,777 B1 | 2/2001 | Darrell et al. |
| 6,215,890 B1 | 4/2001 | Matsuo et al. |
| 6,215,898 B1 | 4/2001 | Woodfill et al. |
| 6,226,396 B1 | 5/2001 | Marugame |
| 6,229,913 B1 | 5/2001 | Nayar et al. |
| 6,256,033 B1 | 7/2001 | Nguyen |
| 6,256,400 B1 | 7/2001 | Takata et al. |
| 6,283,860 B1 | 9/2001 | Lyons et al. |
| 6,289,112 B1 | 9/2001 | Jain et al. |
| 6,299,308 B1 | 10/2001 | Voronka et al. |
| 6,308,565 B1 | 10/2001 | French et al. |
| 6,316,934 B1 | 11/2001 | Amorai-Moriya et al. |
| 6,335,548 B1 | 1/2002 | Roberts et al. |
| 6,363,160 B1 | 3/2002 | Bradski et al. |
| 6,384,819 B1 | 5/2002 | Hunter |
| 6,411,744 B1 | 6/2002 | Edwards |
| 6,430,997 B1 | 8/2002 | French et al. |
| 6,476,834 B1 | 11/2002 | Doval et al. |
| 6,496,598 B1 | 12/2002 | Harman |
| 6,501,167 B2 | 12/2002 | Hanamura |
| 6,503,195 B1 | 1/2003 | Keller et al. |
| 6,539,931 B2 | 4/2003 | Trajkovic et al. |
| 6,570,555 B1 | 5/2003 | Prevost et al. |
| 6,614,056 B1 | 9/2003 | Tarsa et al. |
| 6,633,294 B1 | 10/2003 | Rosenthal et al. |
| 6,640,202 B1 | 10/2003 | Dietz et al. |
| 6,661,918 B1 | 12/2003 | Gordon et al. |
| 6,681,031 B2 | 1/2004 | Cohen et al. |
| 6,714,665 B1 | 3/2004 | Hanna et al. |
| 6,727,643 B2 | 4/2004 | Suehiro |
| 6,731,799 B1 | 5/2004 | Sun et al. |
| 6,738,066 B1 | 5/2004 | Nguyen |
| 6,765,726 B2 | 7/2004 | French et al. |
| 6,788,809 B1 | 9/2004 | Grzeszczuk et al. |
| 6,801,637 B2 | 10/2004 | Voronka et al. |
| 6,821,128 B2 | 11/2004 | Belopolsky et al. |
| 6,873,723 B1 | 3/2005 | Aucsmith et al. |
| 6,876,496 B2 | 4/2005 | French et al. |
| 6,937,742 B2 | 8/2005 | Roberts et al. |
| 6,941,080 B2 | 9/2005 | Kasper et al. |
| 6,950,534 B2 | 9/2005 | Cohen et al. |
| 7,003,134 B1 | 2/2006 | Covell et al. |
| 7,036,094 B1 | 4/2006 | Cohen et al. |
| 7,038,855 B2 | 5/2006 | French et al. |
| 7,039,676 B1 | 5/2006 | Day et al. |
| 7,042,440 B2 | 5/2006 | Pryor et al. |
| 7,050,606 B2 | 5/2006 | Paul et al. |
| 7,058,204 B2 | 6/2006 | Hildreth et al. |
| 7,060,957 B2 | 6/2006 | Lange et al. |
| 7,112,885 B2 * | 9/2006 | Chen .................... H05K 1/0274 257/722 |
| 7,113,918 B1 | 9/2006 | Ahmad et al. |
| 7,121,946 B2 | 10/2006 | Paul et al. |
| 7,170,492 B2 | 1/2007 | Bell |
| 7,184,048 B2 | 2/2007 | Hunter |
| 7,202,898 B1 | 4/2007 | Braun et al. |
| 7,222,078 B2 | 5/2007 | Abelow |
| 7,227,526 B2 | 6/2007 | Hildreth et al. |
| 7,259,747 B2 | 8/2007 | Bell |
| 7,308,112 B2 | 12/2007 | Fujimura et al. |

(56) References Cited

U.S. PATENT DOCUMENTS

| | | | |
|---|---|---|---|
| 7,317,836 B2 | 1/2008 | Fujimura et al. |
| 7,348,963 B2 | 3/2008 | Bell |
| 7,359,121 B2 | 4/2008 | French et al. |
| 7,367,887 B2 | 5/2008 | Watabe et al. |
| 7,379,563 B2 | 5/2008 | Shamaie |
| 7,379,566 B2 | 5/2008 | Hildreth |
| 7,389,591 B2 | 6/2008 | Jaiswal et al. |
| 7,412,077 B2 | 8/2008 | Li et al. |
| 7,421,093 B2 | 9/2008 | Hildreth et al. |
| 7,430,312 B2 | 9/2008 | Gu |
| 7,436,496 B2 | 10/2008 | Kawahito |
| 7,450,736 B2 | 11/2008 | Yang et al. |
| 7,452,275 B2 | 11/2008 | Kuraishi |
| 7,460,690 B2 | 12/2008 | Cohen et al. |
| 7,489,812 B2 | 2/2009 | Fox et al. |
| 7,536,032 B2 | 5/2009 | Bell |
| 7,555,142 B2 | 6/2009 | Hildreth et al. |
| 7,560,701 B2 | 7/2009 | Oggier et al. |
| 7,570,805 B2 | 8/2009 | Gu |
| 7,574,020 B2 | 8/2009 | Shamaie |
| 7,576,727 B2 | 8/2009 | Bell |
| 7,590,262 B2 | 9/2009 | Fujimura et al. |
| 7,593,552 B2 | 9/2009 | Higaki et al. |
| 7,598,942 B2 | 10/2009 | Underkoffler et al. |
| 7,607,509 B2 | 10/2009 | Schmiz et al. |
| 7,620,202 B2 | 11/2009 | Fujimura et al. |
| 7,668,340 B2 | 2/2010 | Cohen et al. |
| 7,680,298 B2 | 3/2010 | Roberts et al. |
| 7,683,954 B2 | 3/2010 | Ichikawa et al. |
| 7,684,592 B2 | 3/2010 | Paul |
| 7,690,817 B2 | 4/2010 | Sanpei et al. |
| 7,701,439 B2 | 4/2010 | Hillis et al. |
| 7,702,130 B2 | 4/2010 | Im et al. |
| 7,704,135 B2 | 4/2010 | Harrison, Jr. |
| 7,710,391 B2 | 5/2010 | Bell et al. |
| 7,729,530 B2 | 6/2010 | Antonov et al. |
| 7,746,345 B2 | 6/2010 | Hunter |
| 7,760,182 B2 | 7/2010 | Ahmad et al. |
| 7,809,167 B2 | 10/2010 | Bell |
| 7,834,846 B1 | 11/2010 | Bell |
| 7,852,262 B2 | 12/2010 | Namineni et al. |
| 7,888,699 B2 | 2/2011 | Oshio et al. |
| RE42,256 E | 3/2011 | Edwards |
| 7,898,522 B2 | 3/2011 | Hildreth et al. |
| 8,035,612 B2 | 10/2011 | Bell et al. |
| 8,035,614 B2 | 10/2011 | Bell et al. |
| 8,035,624 B2 | 10/2011 | Bell et al. |
| 8,072,470 B2 | 12/2011 | Marks |
| 8,233,512 B2 | 7/2012 | Tamaya et al. |
| 8,362,703 B2 | 1/2013 | Kumar et al. |
| 8,610,136 B2 | 12/2013 | Zoorob et al. |
| 8,888,331 B2 | 11/2014 | Mandelboum et al. |
| 2002/0004251 A1 | 1/2002 | Roberts et al. |
| 2002/0101157 A1 | 8/2002 | Suehiro |
| 2003/0032337 A1 | 2/2003 | Sorensen et al. |
| 2005/0025202 A1 | 2/2005 | Kagaya et al. |
| 2006/0249746 A1 | 11/2006 | Oshio |
| 2006/0289202 A1* | 12/2006 | Takeuchi .......... H01L 23/49827 174/262 |
| 2008/0026838 A1 | 1/2008 | Dunstan et al. |
| 2008/0044127 A1 | 2/2008 | Leising et al. |
| 2008/0073738 A1 | 3/2008 | Chang et al. |
| 2008/0290353 A1 | 11/2008 | Medendorp et al. |
| 2009/0236622 A1 | 9/2009 | Nishihara |
| 2009/0296762 A1* | 12/2009 | Yamaguchi ......... H01S 5/02208 372/34 |
| 2010/0014274 A1 | 1/2010 | Shyu et al. |
| 2010/0117099 A1* | 5/2010 | Leung ................ H01L 25/0753 257/88 |
| 2010/0123161 A1 | 5/2010 | Takeuchi et al. |
| 2010/0201280 A1* | 8/2010 | McKenzie .............. H01L 33/46 315/246 |
| 2011/0114369 A1* | 5/2011 | Lee .......................... C25D 5/02 174/252 |
| 2011/0127569 A1 | 6/2011 | Mineshita |
| 2011/0188245 A1 | 8/2011 | Chen |
| 2011/0198662 A1* | 8/2011 | Lin ....................... H01L 21/486 257/99 |
| 2011/0201157 A1* | 8/2011 | Lin ....................... H01L 21/486 438/118 |
| 2012/0140484 A1 | 6/2012 | Sander et al. |
| 2013/0163627 A1* | 6/2013 | Seurin ................ H01S 5/02276 372/36 |
| 2014/0124822 A1* | 5/2014 | Yan ....................... H01L 33/641 257/99 |
| 2014/0327902 A1* | 11/2014 | Giger ..................... G01S 17/08 356/5.01 |

FOREIGN PATENT DOCUMENTS

| | | |
|---|---|---|
| CN | 101254344 A | 9/2008 |
| CN | 201259185 Y | 6/2009 |
| DE | 10313399 A1 | 12/2003 |
| EP | 0583061 A2 | 2/1994 |
| JP | H0844490 A | 2/1996 |
| WO | 9310708 A1 | 6/1993 |
| WO | 9717598 A1 | 5/1997 |
| WO | 9944698 A2 | 9/1999 |

OTHER PUBLICATIONS

International Search Report and Written Opinion Issued in PCT Application No. PCT/US2017/017080, Dated May 16, 2017, 11 Pages.

"Flights into Virtual Reality Treating Real-World Disorders", In Journal of Science Psychology, Mar. 27, 1995, 2 Pages.

"Nanostack Pulsed Laser Diode in Plastic Package, 10W Peak Power; Lead (Pb) Free Product-RoHS Compliant", Retrieved From: http://catalog.osram-os.com/catalogue/catalogue.do?favOid=0000000200020fc100070023&act=showBookmark, Mar. 4, 2009, 6 Pages.

"Pulsed Laser Diodes", in Osram Catalog, Product Family Overview, Oct. 30, 2007, 2 Pages.

"Simulation and Training", in Journal of Division Interactive, Jan. 1994, 6 Pages.

"Virtual High Anxiety", Retrieved from: https://books.google.co.in/books?id=N2YEAAAAMBAJ&pg=PA22&lpg=PA22&dq=Virtual+High+Anxiety,+TECH+update,+August+1995&source=bl&ots=uJDb9jVCke&sig=9EZq7V-IJ_mQ6kvGbPUnlyIsOHQ&hl=en&sa=X&ved=0ahUKEwiuio63pq3JAhWGco4KHXQxDe4Q6AEIHjAB#v=onepage, Aug. 1995, 1 Page.

"Examiner's Answer to Appeal Brief Issued in U.S. Appl. No. 12/957,417", dated Mar. 13, 2017, 6 Pages.

"Final Office Action Issued in U.S. Appl. No. 12/957,417", dated Jan. 2, 2014, 12 Pages.

"Final Office Action Issued in U.S. Appl. No. 12/957,417", dated Jan. 21, 2016, 14 Pages.

"Non Final Office Action Issued in U.S. Appl. No. 12/957,417", dated Jun. 26, 2014, 12 Pages.

"Non Final Office Action Issued in U.S. Appl. No. 12/957,417", dated Jun. 4, 2013, 12 Pages.

"Non Final Office Action Issued in U.S. Appl. No. 12/957,417", dated Jun. 4, 2015, 11 Pages.

"Notice of Allowance Issued in U.S. Appl. No. 12/957,417", dated Sep. 6, 2018, 9 Pages.

"Notice of Allowance Issued in U.S. Appl. No. 12/957,417", dated Jan. 27, 2015, 8 Pages.

"First Office Action Issued in Chinese Patent Application No. 201110409960.X", dated May 21, 2013, 8 Pages.

"Fourth Office Action Issued in Chinese Patent Application No. 201110409960.X", dated Jan. 19, 2015, 6 Pages.

"Notice of Allowance Issued in Chinese Patent Application No. 201110409960.X", dated Jul. 24, 2015, 4 Pages.

"Second Office Action Issued in Chinese Patent Application No. 201110409960.X", dated Dec. 31, 2013, 10 Pages.

"Third Office Action and Search Report Issued in Chinese Patent Application No. 201110409960.X", dated Jul. 17, 2014, 12 Pages.

(56) References Cited

OTHER PUBLICATIONS

Aggarwal, et al., "Human Motion Analysis: A Review", in IEEE Nonrigid and Articulated Motion Workshop, University of Texas at Austin, Jun. 16, 1997, 13 Pages.
Azarbayejani, et al., "Visually Controlled Graphics", in IEEE Transactions on Pattern Analysis and Machine Intelligence, vol. 15, Issue 6, Jun. 1, 1993, 4 Pages.
Breen, et al., "Interactive Occlusion and Collusion of Real and Virtual Objects in Augmented Reality", in Technical Report ECRC-95-02, Jan. 1995, 22 Pages.
Brogan, et al., "Dynamically Simulated Characters in Virtual Environments", in IEEE Computer Graphics and Applications, vol. 18, Issue 5, Sep. 1998, 12 Pages.
Fisher, et al., "Virtual Environment Display System", in Proceedings of the ACM Workshop on Interactive 3D Graphics, Oct. 23, 1986, 12 Pages.
Freeman, et al., "Television Control by Hand Gestures", in Proceedings of Mitsubishi Electric Research Laboratories, TR94-24, Caimbridge, MA, Dec. 1994, 7 Pages.
Granieri, et al., "Simulating Humans in VR", in Publication—British Computer Society, Academic Press, Oct. 12, 1994, 15 Pages.
Hasegawa, et al., "Human-Scale Haptic Interaction with a Reactive Virtual Human in a Real-Time Physics Simulator", in Proceedings of the ACM Computers in Entertainment, vol. 4, Issue 3, Article 6C, Jul. 1, 2006, 12 Pages.
He, Lei, "Generation of Human Body Models", in Thesis Submitted in Partial Fulfillment of the Requirements for the Degree of Master of Science in Computer Science, University of Auckland, New Zealand, Apr. 2005, 111 Pages.
Hongo, et al., "Focus of Attention for Face and Hand Gesture Recognition Using Multiple Cameras", in IEEE Fourth International Conference on Automatic Face and Gesture Recognition, Mar. 28, 2000, 6 Pages.
Isard, et al., "Condensation—Conditional Density Propagation for Visual Tracking", in Proceedings of the International Journal of Computer Vision, vol. 29, Issue 01, Aug. 1998, 24 Pages.
Kanade, et al., "A Stereo Machine for Video-Rate Dense Depth Mapping and Its New Applications", in IEEE Computer Society Conference on Computer Vision and Pattern Recognition, Jan. 1996, 7 Pages.
Kohler, Markus, "Special Topics of Gesture Recognition Applied in Intelligent Home Environments", in Proceedings of the International Gesture Workshop on Gesture and Sign Language in Human-Computer Interaction, Sep. 17, 1997, 12 Pages.
Kohler, Markus, "Technical Details and Ergonomical Aspects of Gesture Recognition Applied in Intelligent Home Environments", Retrieved from Internet: https://pdfs.semanticscholar.org/0210/daa859d8574b1e1f98f809814e83022c75e4.pdf, Jan. 1997, 35 Pages.
Kohler, Markus, "Vision Based Remote Control in Intelligent Home Environments", in Proceedings of the 3D Image Analysis and Synthesis, vol. 96, Nov. 1996, 8 Pages.
Livingston, Mark Alan, "Vision-Based Tracking with Dynamic Structured Light for Video See-through Augmented Reality", A Dissertation Submitted to the Faculty of the University of North Carolina at Chapel Hill in Partial Fulfillment of the Requirements for the Degree of Doctor of Philosophy in the Department of Computer Science, Jan. 1998, 145 Pages.
Miyagawa, et al., "CCD-Based Range Finding Sensor", in IEEE Transactions on Electron Devices, vol. 44, Issue 10, Oct. 1997, 5 Pages.
Muhlfeld, et al., "Design Strategies for Stray Inductance Optimized Wire-Bond Power Modules", in Proceedings of International Exhibition & Conference for Power Electronics, Intelligent Motion, Power Quality, Jan. 2010, 5 Pages.
Pavlovic, et al., "Visual Interpretation of Hand Gestures for Human-Computer Interaction: A Review", in IEEE Transactions on Pattern Analysis and Machine Intelligence, vol. 19, Issue 7, Jul. 1, 1997, 19 Pages.
"International Search Report Issued in PCT Application No. PCT/US2012/036385", dated Oct. 23, 2012, 9 Pages.
Qian, et al., "A Gesture-Driven Multimodal Interactive Dance System", in IEEE International Conference on Multimedia and Expo (ICME), Jun. 2004, 4 Pages.
Rosenhahn, et al., "Automatic Human Model Generation", in Proceedings of International Conference on Computer Analysis of Images and Patterns, Jan. 2005, 8 Pages.
Shao, et al., "An Open System Architecture for a Multimedia and Multimodal User Interface", in Proceedings of 3rd TIDE Congress, Aug. 24, 1998, 8 Pages.
Sheridan, et al., "Virtual Reality Check", in Journal of Technology Review, vol. 96, Issue 07, Oct. 1993, 9 Pages.
Wren et al., "Pfinder: Real-Time Tracking of the Human Body", in IEEE Transactions on Pattern Analysis and Machine Intelligence, vol. 19, Issue 7, Jul. 1997, 6 Pages.
Zhao, Liang, "Dressed Human Modeling, Detection, and Parts Localization", Submitted in Partial Fulfillment of the Requirements for the Degree of Doctor of Philosophy, The Robotics Institute, Carnegie Mellon University, Pittsburgh, Jul. 26, 2001, 121 Pages.
"Notice of Allowance Issued in U.S. Appl. No. 12/957,417", dated Oct. 31, 2018, 8 Pages.

* cited by examiner

LASER DIODE CHIP ON PRINTED CIRCUIT BOARD

BACKGROUND

Illumination systems configured to produce a train of light pulses that are repeated at high frequency may be used for various artistic, medical, technological, military, and scientific applications. Generally, the illumination systems comprise a semiconductor light source such as a light emitting diode (LED) or a laser diode (LD) encapsulated in a protective package having electrically conducting leads or pads for coupling the light source to a source of power. As semiconductor light sources convert only between about 10% to about 50% of energy they receive to useful optical output, a large balance of the energy they receive is converted to heat, which must be dissipated to prevent their damage and enable their efficient operation. Typically, the light sources are mounted to a thermally conducting submount for conducting heat that they generate during operation to a suitable heat sink.

By way of an illustrative example application, a gated time of flight (GT-TOF) range camera may use such an illumination system to illuminate a scene that it images with a train of light pulses to acquire a "range image" of a scene that provides distance measurements to features in the scene. Following transmission of each light pulse in the light pulse train, the GT-TOF camera gates ON for a short exposure period during which pixels in a photosensor of the camera are sensitive to, and register light incident on the pixels. During the short exposure period following a light pulse, a pixel imaging light from a given feature in the scene registers an amount of light that the given feature reflects from the light pulse back to the camera. The camera uses an amount of reflected light that the pixel registers for the given feature during the exposure periods from, typically, all the light pulses in the light pulse train to determine a round trip time for light to travel from the camera to the given feature and back to the camera. The round trip time for the feature and the speed of light are used to determine a distance to the feature.

Light pulses in a light pulse train that a light source in a GT-TOF camera transmits to illuminate a scene that the GT-TOF camera images and exposure periods of the camera may have pulse widths as short as a few nanoseconds and repetition frequencies greater than a megahertz (MHz). As it is generally advantageous to acquire a range image of a scene in as short a time as possible, it is advantageous that a number of light pulses in the light pulse train and associated exposure periods be as small as possible. However, as pulse widths get shorter and repetition rates faster, it can be technically challenging to generate the light pulses with sufficient intensity and pulse shape uniformity so that distance measurements provided by the GT-TOF camera have acceptable accuracy and signal to noise ratios (SNR). Cost considerations and heat dissipation requirements for maintaining the light source and the camera at acceptable operating temperatures usually limit intensity of illumination provided by the light source. The fast switching demands mandated by short pulse widths and high repetition rates of light pulses that the light source generates, and common constraints that electronic and optical components of systems have small footprints compound the challenges.

SUMMARY

An aspect of an embodiment of the disclosure relates to providing a light source module (LSM) comprising a semiconductor light source that is directly mounted to a multilayer printed circuit board (ML-PCB) configured to provide the light source with enhanced heat dissipation and is operable to control the light source to transmit relatively short light pulses at high repetition rates. In an embodiment, the ML-PCB comprises a multilayer core and a plurality of build-up layers optionally on both side of the core. The core layers comprise at least one plane, hereinafter also referred to as a "heat sink plane" that is a good thermal and electrical conductor. In an embodiment, the at least one heat sink plane comprises a plurality of heat sink planes that are electrically and thermally coupled by a plurality of buried vias. A top layer of the ML-PCB is formed having a surface mount technology (SMT) pad, hereinafter also referred to as a "light source pad" or "SMT pad", and at least one trace, hereinafter also referred to as a "light source power trace" or "power trace". An electrode, optionally a cathode, of the light source is electrically and thermally bonded to the SMT light source pad by an electrically and thermally conducting epoxy or adhesive, generically be referred to as a conducting epoxy. An electrode, optionally an anode of the light source, is connected to the at least one power trace by relatively short bond wires. A light source driver is optionally mounted to the top plane in close proximity to the light source and electrically connected to the light source pad. In accordance with an embodiment, the light source pad and at least one power trace are formed having a relatively dense distribution of microvias that establish thermal and electrical connection to the at least one heat sink plane in the core. The dense distribution of microvias provides efficient dissipation of heat generated by the light source during operation that improve performance of the light source. The proximity of the light source driver to the light source, the relatively short bond wires, and coupling of the light source cathode directly to the light source SMT pad provide a relatively low inductance coupling of the driver to the light source. The low inductance facilitates driving the light source to generate short light pulses transmitted at high repetition rates. Whereas the semiconductor light source may be any of various semiconductor light sources, for convenience of presentation the following description and discussion assumes that the light source is a LD.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF FIGURES

Non-limiting examples of embodiments of the disclosure are described below with reference to figures attached hereto that are listed following this paragraph. Identical features that appear in more than one figure are generally labeled with a same label in all the figures in which they appear. A label in a figure labeling an icon representing a given feature of an embodiment of the disclosure may be used to reference the given feature represented by the icon. Dimensions of features shown in the figures are chosen for convenience and clarity of presentation and are not necessarily shown to scale.

DETAILED DESCRIPTION

In the description below, a light source module (LSM) in accordance with an embodiment of the disclosure, is described with reference to FIG. 1. The LSM in accordance with an embodiment comprises an LD mounted directly, without a submount, to a top layer of an ML-PCB, optionally having a 2-4-2 stack-up configuration. Advantages that may be provided by the LSM in mitigating thermal degradation of performance of an LD comprised in the module are discussed with reference to graphs shown in FIG. 2 and FIGS. 3A and 3B.

Figure 1:
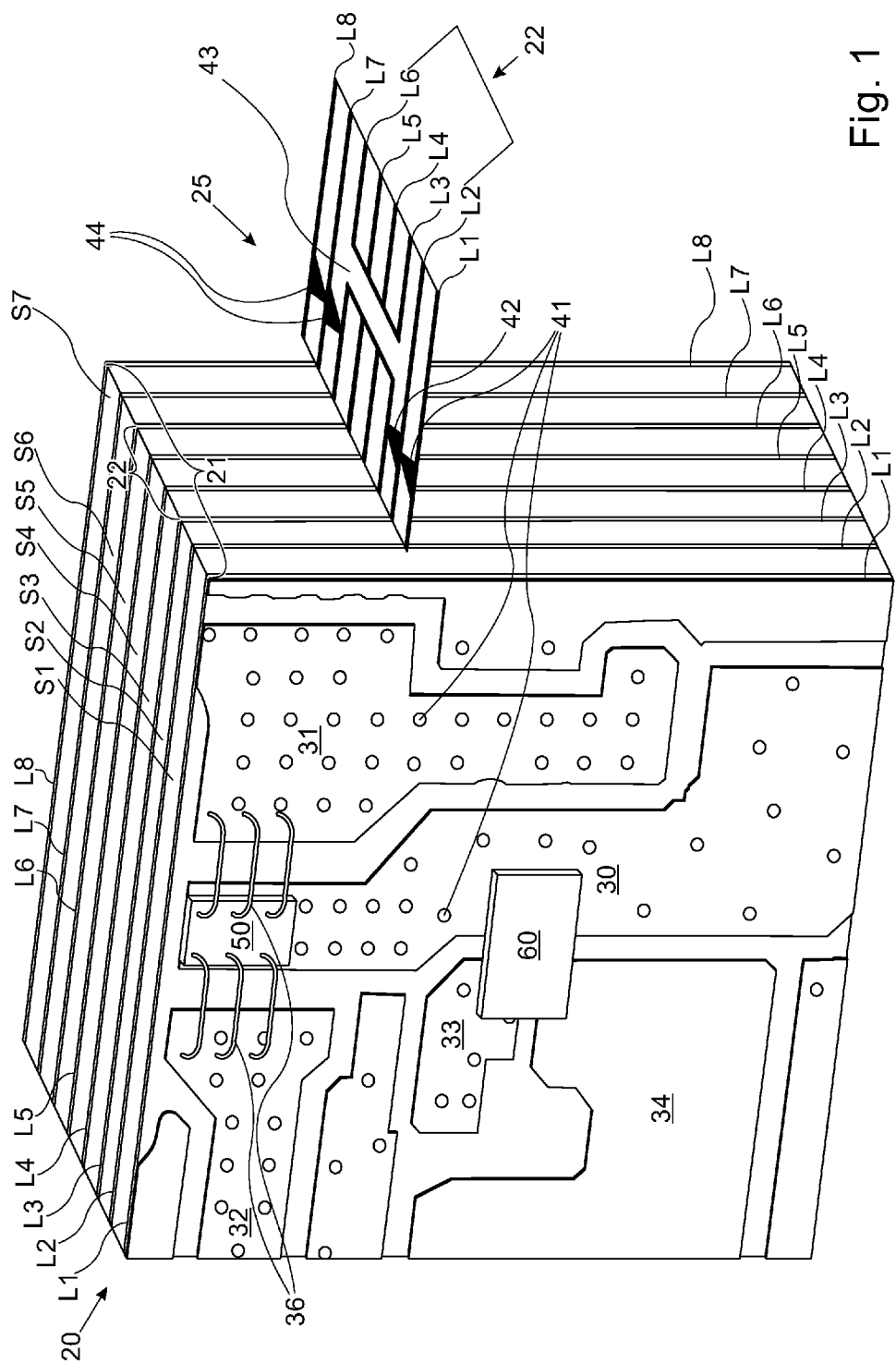
FIG. 1 schematically shows a light source module comprising an LD mounted to an ML-PCB, in accordance with an embodiment of the disclosure.
Figure 2:
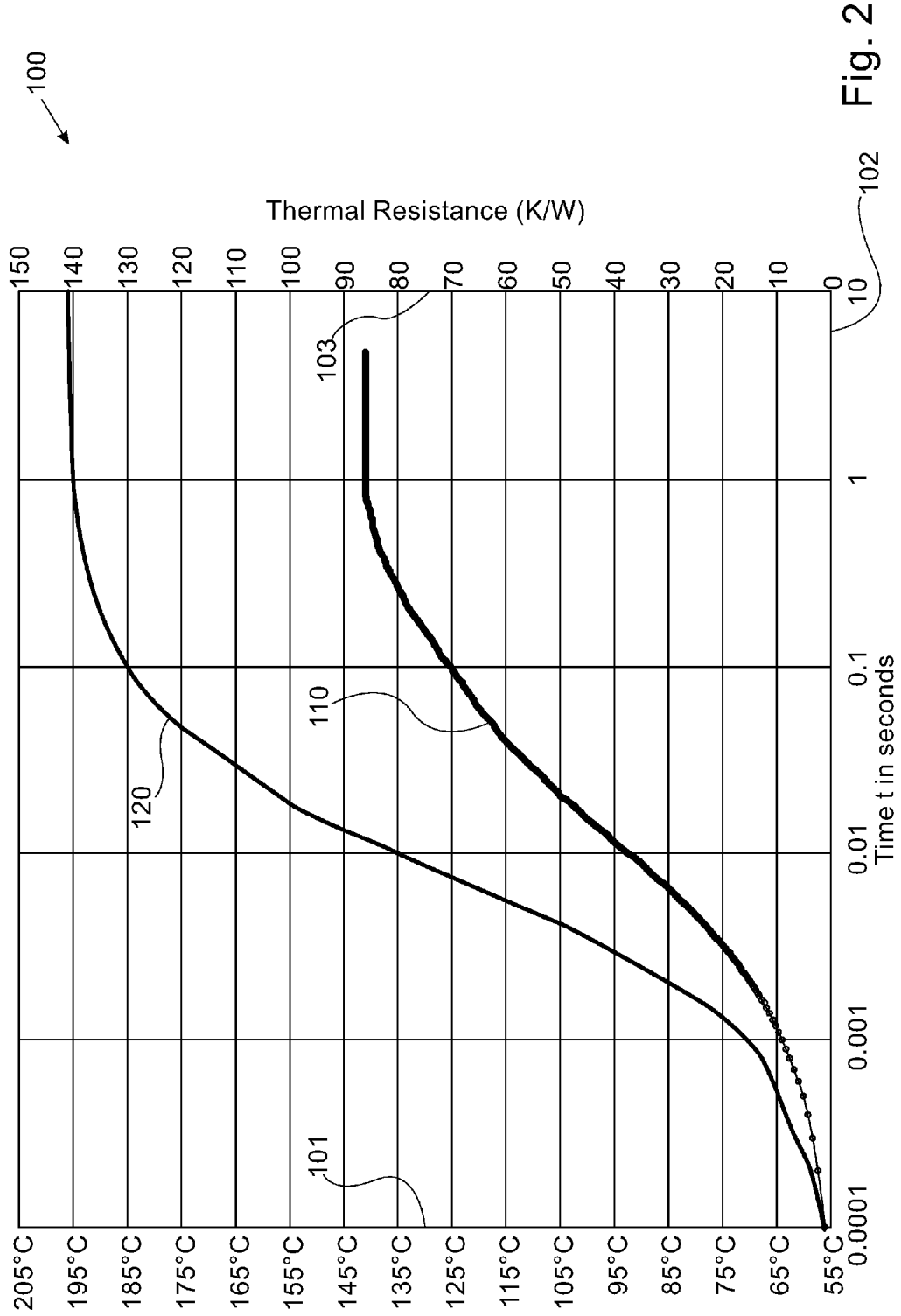
FIG. 2 shows a graph of thermal resistance of a light source module as a function of energy provided to an LD in the module, in accordance with an embodiment of the disclosure.
Figure 3A:
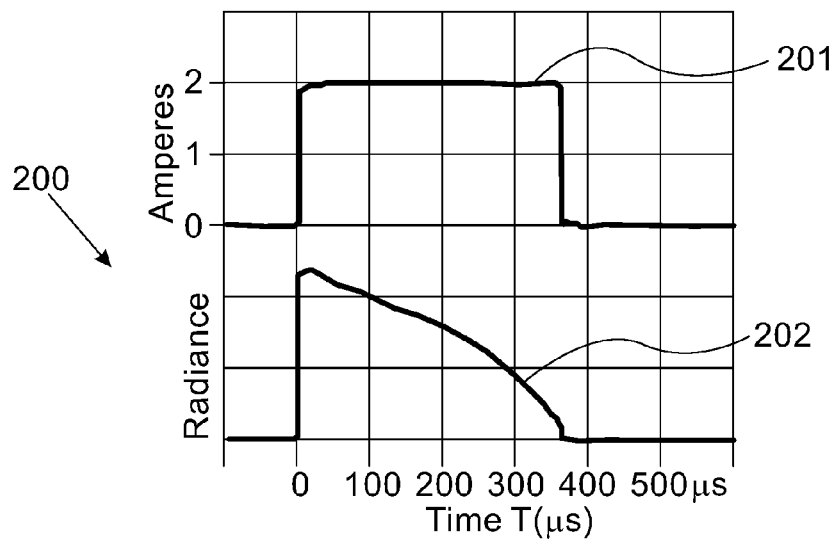
FIG. 3A shows a graph, of optical output measured as a function of time of a light source module driven by a substantially constant current, in accordance with an embodiment of the invention.
Figure 3B:
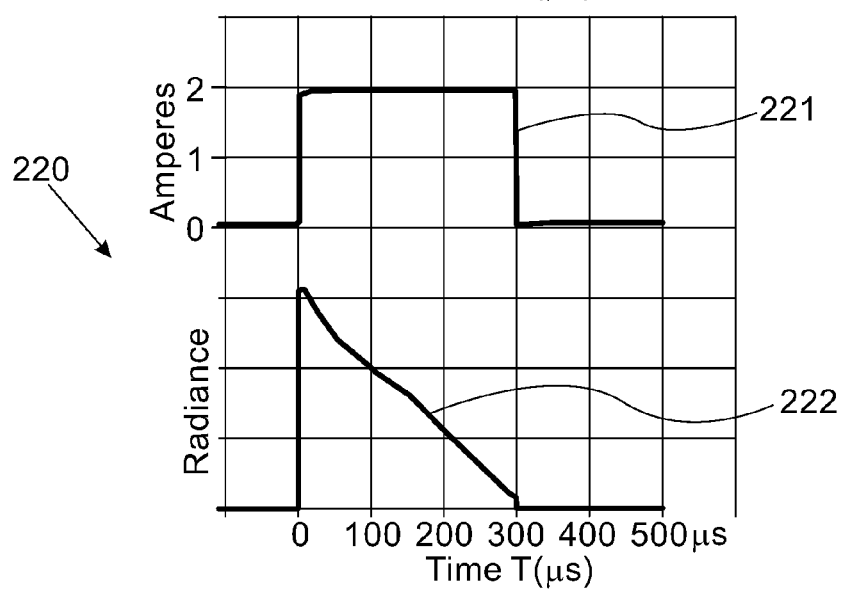
FIG. 3B shows a graphs of optical output measured as a function of time of a commercially available light source module driven by a substantially same magnitude current as that driving the light source module for which the graph in FIG. 3A was acquired.

FIG. 2 shows a graph of thermal resistance, K/W (degrees Kelvin per Watt) for dissipating heat generated by an LD comprised in a simulated LSM that does not comprise a submount, in accordance with an embodiment of the disclosure similar to that shown in FIG. 1, as a function of energy supplied to the LD. For comparison, the graph shows thermal resistance for dissipating heat generated by an LD comprised in a simulated conventional light source module comprising a submount mounted to a PCB and operated under substantially same conditions for which the LSM shown in FIG. 1 is operated to provide the graph. The simulated conventional light source module exhibits substantially greater thermal resistance and operating temperatures than the LSM in accordance with an embodiment of the disclosure. FIGS. 3A and 3B show graphs of optical radiance of light source modules as a function of integrated energy provided to an LD comprised in the modules. FIG. 3A shows measured optical output as a function of integrated energy provided for an LSM in accordance with an embodiment of the disclosure similar to that schematically shown in FIG. 1. FIG. 3B shows measured optical output as a function of integrated energy for a conventional light source module comprising an LD mounted to a submount. FIGS. 3A and 3B indicate that the radiance of the conventional light source module decreases with integrated input energy precipitously in comparison to decrease of radiance with integrated input energy indicated for the LSM in accordance with an embodiment of the disclosure.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended. Unless otherwise indicated, the word "or" in the description and claims is considered to be the inclusive "or" rather than the exclusive or, and indicates at least one of, or any combination of items it conjoins.

FIG. 1 schematically shows an LSM 20, in accordance with an embodiment of the disclosure. LSM 20 comprises a multilayer PCB, ML-PCB 21, having a plurality of N layers, L1, L2, ..., LN and comprising a laser diode, LD 50, and an LD driver 60 mounted to a top layer, L1, of ML-PCB 21, in accordance with an embodiment of the disclosure. By way of non-limiting example, in FIG. 1 N=8 for ML-PCB 21, and the ML-PCB comprises, optionally copper, conductive layers L1, L2, ... L8 formed on insulating substrate panels S1-S7, optionally configured in a 2-4-2 stack-up. The 2-4-2 stack-up may comprise a core 22 of four layers L3-L6, and build up layers L1, L2 on one side of the core and build-up layers L7, L8 on an opposite side of the core. Structure of the stack-up of ML-PCB 21 is shown in a stack-up schematic 25 at a side of ML-PCB 21.

Top layer L1 is formed having a conductive pattern comprising an SMT pad 30 two LD power traces 31 and 32, a ground contact pad 33 and a signal trace 34. LD 50 is optionally an edge emitting laser diode and is bonded to SMT pad 30 by a heat and electrically conducting epoxy (not shown) so that, optionally a cathode electrode (not shown), of the LD is in thermal and electrical contact with SMT pad 30. A plurality of bond wires 36 may electrically connect, optionally an anode electrode (not shown) of LD 50 to each of LD power traces 31 and 32. A laser diode driver, LD 50, operable to power LD 50 is optionally electrically connected to power ground contact pad 33, SMT pad 30, and LD signal trace 34. In an embodiment, each power trace 31 and 32 biases the anode of LD 50 positive via an array of drive capacitors (not shown). LD driver 60 may comprise at least one switch (not shown) that operates responsive to control signals that a suitable controller (not shown) provides on LD signal trace 34 to connect and disconnect SMT pad 30 respectively to and from ground contact pad 33. Connecting SMT pad 30 to ground connects the cathode of LD 50 to ground and discharges the drive capacitors through LD 50 to cause the LD to lase and transmit light as required for an application for which LSM 20 is to be used.

LSM 20 may be adapted and configured to provide light for any of various artistic, medical, technological, and/or scientific applications. For convenience of discussion it is assumed that LSM 20 may be configured for use with a GT-TOF camera (not shown). LD 60 may therefore operate to repeatedly connect and disconnect SMT pad 30 to discharge the drive capacitors and drive current through LD 50 to cause the LD to transmit a train of light pulses for illuminating a scene that the camera images to acquire a range image. In an embodiment, the light pulses may be transmitted at a relatively high repetition rate and be characterized by relatively small pulse widths. By way of example, the pulse widths may have pulse widths less than or equal to about 5 nanoseconds (ns) and be transmitted at a transmission repetition rates greater than or equal to about 100 MHz. To provide for the relatively short light pulses and high pulse repetition frequency, the conductive pattern of layer L1 is configured in accordance with an embodiment of the disclosure to provide for a relatively low inductance connection between LD driver 60 and LD 50. Power traces 31 and 32 are positioned close to and on opposite sides of SMT pad 30 so that bond wires 36 may be made relatively short to provide low inductance connections between LD power trances 31 and 32 and LD 50. In an embodiment, bond wires 36 are less than 2 mm long. Optionally, the bond wires are less than or equal to about 1.5 mm long. Optionally the bond wires have a length less than or about equal to 1 mm. In an embodiment the length of the bond wires is equal to about 0.6 mm. And whereas in FIG. 1 each LD power trace 31 and 32 is connected by three bond wires 36 to the LD, a number of bond wires connecting each power trace to LD 50 may different from three. In addition, LD driver 60 is positioned close to LD 50 to reduce parasitic inductance. To moderate transient voltage spikes that might develop across LD 50 when rapidly switching ON and switching OFF LD 50 to generate short light pulses, a flyback Shottky diode (not shown) is connected antiparallel to LD 50 to moderate rate of change of current through LD 50.

To dissipate heat generated by LD 50 during its operation, the epoxy that bonds LD 50 to SMT pad 30 has a relatively high thermal conductance and SMT pad 30 is optionally relatively large. The SMT pad, power traces, and power supply contact pad 30, 31, 32, 33, and 34 are formed having a plurality of copper micro vias 41, schematically shown on layer L1 of ML-PCB 21 and in stack-up schematic 25. Microvias 41 thermally couple the pads and traces comprised in layer L1 to layer L2, and L2 is in turn thermally connected by a plurality of microvias 42 one of which is shown in stack-up schematic 25 to layer L3 in core 22. Layers L3-L6 comprised in core 22 are electrically and thermally connected by a plurality of buried vias 43, only one of which is shown in stack-up schematic 25. Layers L7 and L8 are thermally connected by microvias 44 to layer L6 of core 22. In an embodiment of the disclosure all the layers in core 22 function as heat sink planes in ML-PCB21.

Heat sink planes in layers L4-L6, microvias 41, 42, and 43, and buried vias 44 that characterize MC-PCB 21 have a density and distribution pattern in accordance with an embodiment of the invention that provide LD 50 and other circuits that may be formed on layer L1 with a structure of heat sinks that efficiently dissipate heat generated by LD 50 during its operation.

By way of a numerical example, LSM module 20 may have thickness perpendicular to layers L1-L8 equal to about 1 millimeter and dimensions in planes parallel to the layers equal to about 4 mm× about 4 mm. The epoxy that bonds LD 50 to SMT pad 30 may have thermal conductivity greater than or equal to about 10 W/m-K (watts per meter-degree Kelvin). A suitable conductive epoxy for bonding LD 50 to SMT pad 30 may be a conductive epoxy having a thermal conductivity 20 W/m-K marketed by Kaken Tech of Japan under a stock keeping unit (SKU) CR-3520, or a conductive epoxy having a thermal conductivity of 60 W/m-K marketed by DieMat Inc of the United States under the SKU DM6030 Hk. LD 50 may be any of various laser diodes that lase in an optical bandwidth suitable for a purpose for which LSM module 20 is to be used and may for example operate to provide light in the visible spectrum or light in the infrared (IR) spectrum. Optionally, LD 50 is a large optical cavity, infrared (IR) laser diode that lases at 850 nm having an optical cavity length of about 900 micrometers (μm) and an active region width equal to or greater than about 250 μm. Optionally, the active region has a width equal to about 400 μm. Layers L1, L2, L7, and L8 may be formed from copper about 30 micrometers (μm) thick and core layers L3-L6 may be formed from copper 25 μm thick. In an embodiment, substrates S1, S2, S6, and S7 are about 60 μm thick, core substrates S3 and S5 are about 100 μm thick, and substrate S4 is about 300 μm thick. Microvias 41, 42, 44 may have a diameter equal to or less than about 150 μm and are optionally copper filled. Buried vias 43 may have diameters equal to about 200 μm and may be copper plated. In an embodiment, microvias 41 in an area of SMT pad 30 to which LD 50 is bonded may be arrayed at a pitch less than or equal to about 400 μm. In an embodiment the pitch is equal to about 250 μm. Optionally, a density of microvias decreases, and a pitch at which the microvias are arrayed increases with distance from LD 50. In an embodiment, buried vias 43 are distributed in an area to which LD 50 is bonded to SMT pad 30 in an array having a pitch less than or equal to about 1 mm. Optionally, the pitch is less than or equal to about 500 μm.

FIG. 2 displays a semi-log graph 100 having a curve 110 that shows simulated temperature, T(t), of LD 50 (FIG. 1) as a function of duration of time, t, for which LD driver 60 provides 1 watt of power to LD 50 during operation of LSM 20 with layer L8 of ML-PCB maintained at a temperature of about 55° C. in an environment having ambient temperature of about 30° C. LD 50 used to acquire graph 100 is an LD marketed by OSRAM GmbH of Germany under the part number (PN) SPL DL85_3_900. A curve 120 shows simulated temperature, T(t), of the same LD, operated under identical conditions for which curve 110 was obtained, but mounted to an Aluminum Nitride (AlN) submount and packaged in a conventional LD package marketed by OSRAM. In semi-log graph 100, temperature T(t) in degrees centigrade is shown along a left hand ordinate 101 graduated in a linear temperature scale, and time in seconds is shown along an abscissa 102 graduated in a log time scale. A right hand ordinate 103 of semi-log graph 100 shows values of thermal resistance in units K/W (degrees Kelvin divided by Watts) corresponding to temperatures T(t) shown along left hand ordinate 101 of the semi-log graph. A value for thermal resistance K/W corresponding to a temperature T(t) is defined as (T(t)-55° C.)/1 W since layer L8 is maintained at 55° C. and LD driver 60 delivers 1 Watt of power to LD 50.

Curve 110 shows that under the operating conditions of LSM 20 for which semi-log graph 100 was obtained, LSM 20 relaxes to an equilibrium temperature of about 140° C. and equilibrium thermal resistance of about 87 K/W. In contrast, curve 120 shows that the LD conventionally mounted to a submount operates at higher temperatures at all times t than the LD mounted in LSM 20 in accordance with an embodiment of the disclosure. The conventionally mounted LD converges to an equilibrium temperature of about 195° C. and an equilibrium thermal resistance of about 140 K/W.

FIG. 3A shows a simulated graph 200 of optical output of LSM 20 as a function of time t in microseconds (μs) during which a current of two amperes is driven through LD 50 by LD driver 60. LD 50 used to acquire graph 200 was the same as the LD used to generate curves 110 and 120 in graph 100. A top curve 201 in the graph shows current provided to LD 50 as a function of time and a bottom curve 202 in the graph shows corresponding radiance of LSM 20 in arbitrary units as a function of time. Curve 202 shows that radiance provided by LD 50 responsive to the 2A current decreases from a maximum at time t =0, to 83% of maximum at time 100 μs, 67% of maximum at time 200 μs and to about 37% at time 300 μs. The radiance decreases to about 0 at time 360 μs.

FIG. 3B shows a graph 220 of radiance as a function of time provided by the OSRAM LD used to acquire graph 200 in FIG. 3A mounted to an Aluminum Nitride (AlN) submount and operated under conditions similar to those for which graphs in FIGS. 2 and 3A were acquired for LSM 20. In FIG. 3B a curve 221 shows a two ampere current pulse applied to the LD in the OS light source module, and a curve 222 shows radiance provided by the OS module. The OS module shows inferior thermal performance in comparison to the thermal performance of LSM 20. At 100 μs the OS module radiance decreases to about 63% of its maximum, at 200 μs the radiance is decreased to about 38% of maximum, and at 300 μs the radiance is substantially equal to zero.

There is therefore provided in accordance with an embodiment of the disclosure a multilayer printed circuit board (ML-PCB) having: a core comprising a plurality of core layers electrically and thermally coupled by a plurality of buried vias wherein at least one of the core layers comprises a heat sink plane; a top layer on a first side of the core having formed thereon a first conducting element and second and third conducting elements respectively on either side of the first pad, wherein each of the conducting elements is thermally coupled to the heat sink plane of the at least one core layer by a plurality of microvias; a bottom layer on a second side of the core opposite the first side; and a semiconducting light source having a first electrode bonded to the first conducting element with a thermally and electrically conducting epoxy and electrically connected to each of the second and third electrodes by a plurality of bond wires.

Optionally, at least two of the plurality of core layers comprises a heat sink plane and all the heat sink planes are thermally coupled by the plurality of buried vias. Optionally, the plurality of buried vias are arrayed at a pitch less than or equal to about 500 μm. Additionally or alternatively, the at least two of the core layers comprises all of the core layers. In an embodiment the plurality of microvias that couple the first conducting element to the heat sink plane of the at least one core layer are distributed in array having a pitch less than or equal to about 400 μm in an area of the first conducting element to which the first electrode of the semiconductor laser diode is bonded. Optionally, the pitch is less than or equal to about 300 μm. Optionally, the pitch is less than or equal to about 250 μm.

In an embodiment the bond wires have a length less than about 1.0 mm. In an embodiment the bond wires have a length less than about 600 μm.

In an embodiment the epoxy is characterized by thermal conductivity greater than or equal to about 10 W/m-K (watts per meter-degree Kelvin).

In an embodiment, the core comprises at least four core layers, each of which comprises a heat sink plane. Optionally, the ML-PCB has a 2-4-2 stack-up structure.

In an embodiment, the light source module is characterized by a thermal relaxation time that is less than or equal to about 1 second.

In an embodiment, the light source module comprises a light source driver electrically connected to the first, second, and third conducting elements that generates current flow to or from the light source via the first conducting element and respectively from or to the light source via the second and third conducting elements to control emission of light by the light source. Optionally, inductance of the electrical connections of the light source driver to the conducting elements and the electrical connections of the conducting elements to the light source is less than or equal to about 1 nanohenries (nH).

There is further provided in accordance with an embodiment of the disclosure, a camera comprising: a light source module in accordance with an embodiment of the disclosure; and a controller configured to control the light source module to transmit light to illuminate a scene that the camera images. Optionally the camera comprises a gated time of flight range camera.

In the discussion, unless otherwise stated, adjectives such as "substantially" and "about" modifying a condition or relationship characteristic of a feature or features of an embodiment of the disclosure, are understood to mean that the condition or characteristic is defined to within tolerances that are acceptable for operation of the embodiment for an application for which it is intended. Unless otherwise indicated, the word "or" in the description and claims is considered to be the inclusive "or" rather than the exclusive or, and indicates at least one of, or any combination of items it conjoins.

In the description and claims of the present application, each of the verbs, "comprise" "include" and "have", and conjugates thereof, are used to indicate that the object or objects of the verb are not necessarily a complete listing of components, elements or parts of the subject or subjects of the verb.

Descriptions of embodiments of the disclosure in the present application are provided by way of example and are not intended to limit the scope of the disclosure. The described embodiments comprise different features, not all of which are required in all embodiments. Some embodiments utilize only some of the features or possible combinations of the features. Variations of embodiments of the disclosure that are described, and embodiments comprising different combinations of features noted in the described embodiments, will occur to persons of the art. The scope of the invention is limited only by the claims.

The invention claimed is:

1. A light source module comprising:
a multilayer printed circuit board (ML-PCB) having:
a core comprising a plurality of core layers electrically and thermally coupled by a plurality of buried vias wherein at least one of the plurality of core layers comprises a heat sink plane;
a top layer on a first side of the core having formed thereon a first conducting element and second and third conducting elements respectively on either side of the first conducting element, wherein each of the first, second, and third conducting elements is thermally coupled to the heat sink plane of the at least one of the plurality of core layers by a plurality of microvias;
a bottom layer on a second side of the core opposite the first side; and
a semiconducting light source having a first electrode bonded to the first conducting element with a thermally and electrically conducting epoxy and electrically connected to each of the second and third electrodes by a plurality of bond wires.

2. The light source module according to claim 1 wherein a second core layer of the plurality of core layers comprises a second heat sink plane and wherein the heat sink plane and the second heat sink plane are thermally coupled by the plurality of buried vias.

3. The light source module according to claim 2 wherein the plurality of buried vias are arrayed at a pitch less than or equal to about 500 μm.

4. The light source module according to claim 2 wherein the at least one of the plurality of core layers and the second core layer of the plurality of core layers comprises all of the plurality of core layers.

5. The light source module according to claim 1 wherein the plurality of microvias that couple the first conducting element to the heat sink plane of the at least one of the plurality of core layers are distributed in array having a pitch less than or equal to about 400 μm in an area of the first conducting element to which the first electrode of the semiconducting light source is bonded.

6. The light source module according to claim 5 wherein the pitch is less than or equal to about 300 μm.

7. The light source module according to claim 6 wherein the pitch is less than or equal to about 250 μm.

8. The light source module according to claim 1 wherein the plurality of bond wires have a length less than about 1.0 mm.

9. The light source module according to claim 1 wherein the plurality of bond wires have a length less than about 600 μm.

10. The light source module according to claim 1 wherein the electrically conducting epoxy is characterized by thermal conductivity greater than or equal to about 10 W/m-K (watts per meter-degree Kelvin).

11. The light source module according to claim 1 wherein the core comprises at least four core layers, each of which comprises a heat sink plane.

12. The light source module according to claim 11 wherein the ML-PCB has a 2-4-2 stack-up structure.

13. The light source module according to claim 1 characterized by a thermal relaxation time that is less than or equal to about 1 second.

14. The light source module according to claim 1, further comprising a light source driver electrically connected to the first, second, and third conducting elements that generates current flow to or from the semiconducting light source via the first conducting element and respectively from or to the semiconducting light source via the second and third conducting elements to control emission of light by the semiconducting light source.

15. The light source module according to claim 14 wherein inductance of electrical connections of the light source driver to the first, second, and third conducting elements and electrical connections of the first, second, and third conducting elements to the semiconducting light source is less than or equal to about 1 nanohenries (nH).

16. A camera comprising:
a memory; and
a light source component comprising:
 a multilayer printed circuit board (ML-PCB) comprising:
  a core comprising a plurality of core layers electrically and thermally coupled by a plurality of buried vias wherein at least one of the plurality of core layers comprises a heat sink plane;
  a top layer on a first side of the core having formed thereon a first conducting element and second and third conducting elements respectively on either side of the first conducting element, wherein each of the first, second, and third conducting elements is thermally coupled to the heat sink plane of the at least one of the plurality of core layers by a plurality of microvias;
  a bottom layer on a second side of the core opposite the first side; and
  a semiconducting light source having a first electrode bonded to the first conducting element with a thermally and electrically conducting epoxy and electrically connected to each of the second and third electrodes by a plurality of bond wires.

17. The camera according to claim 16, further comprising a controller configured to control the light source component to transmit light to illuminate a scene.

18. The camera according to claim 16, wherein a second core layer of the plurality of core layers comprises a second heat sink plane and wherein the heat sink plane and the second heat sink plane are thermally coupled by the plurality of buried vias.

19. The camera according to claim 16, wherein the plurality of microvias that couple the first conducting element to the heat sink plane of the at least one of the plurality of core layers are distributed in array having a pitch less than or equal to about 400 μm in an area of the first conducting element to which the first electrode of the semiconducting light source is bonded.

20. A system comprising:
a memory; and
a camera comprising a light source component, the light source component comprising:
 a multilayer printed circuit board (ML-PCB) comprising:
  a core comprising a plurality of core layers electrically and thermally coupled by a plurality of buried vias wherein at least one of the plurality of core layers comprises a heat sink plane;
  a top layer on a first side of the core having formed thereon a first conducting element and second and third conducting elements respectively on either side of the first conducting element, wherein each of the first, second, and third conducting elements is thermally coupled to the heat sink plane of the at least one of the plurality of core layers by a plurality of microvias;
  a bottom layer on a second side of the core opposite the first side; and
  a semiconducting light source having a first electrode bonded to the first conducting element with a thermally and electrically conducting epoxy and electrically connected to each of the second and third electrodes by a plurality of bond wires.

* * * * *